United States Patent
T'Ng et al.

(10) Patent No.: US 10,026,765 B2
(45) Date of Patent: Jul. 17, 2018

(54) APPARATUS AND SENSOR CHIP COMPONENT ATTACHING METHOD

(71) Applicant: PixArt Imaging (Penang) SDN. BHD., Penang (MY)

(72) Inventors: Chee Pin T'Ng, Penang (MY); Sai Mun Lee, Penang (MY)

(73) Assignee: PixArt Imaging (Penang) SDN. BHD., Penang (MY)

( * ) Notice: Subject to any disclaimer, the term of this patent is extended or adjusted under 35 U.S.C. 154(b) by 16 days.

(21) Appl. No.: 14/937,890

(22) Filed: Nov. 11, 2015

(65) Prior Publication Data
US 2017/0133422 A1    May 11, 2017

(51) Int. Cl.
| H01L 31/0232 | (2014.01) |
| H01L 21/8222 | (2006.01) |
| H01L 27/146 | (2006.01) |
| G02B 7/02 | (2006.01) |
| G02B 27/00 | (2006.01) |

(52) U.S. Cl.
CPC ........ *H01L 27/14627* (2013.01); *G02B 7/025* (2013.01); *G02B 27/0006* (2013.01); *H01L 27/14685* (2013.01)

(58) Field of Classification Search
CPC ................................ H01L 27/14618
USPC ......................... 257/432; 438/340
See application file for complete search history.

(56) References Cited

U.S. PATENT DOCUMENTS

| 6,178,016 B1* | 1/2001 | Ashe ........................ H04N 1/03 358/474 |
| 6,256,118 B1* | 7/2001 | Moriarty ............. B29C 65/1406 358/471 |
| 2008/0122967 A1* | 5/2008 | Huang ..................... G02B 7/08 348/340 |
| 2008/0157250 A1* | 7/2008 | Yang ................ H01L 27/14618 257/433 |
| 2008/0191333 A1* | 8/2008 | Yang ................... H01L 21/6835 257/680 |
| 2008/0211075 A1* | 9/2008 | Yang ................ H01L 27/14618 257/680 |
| 2008/0316623 A1* | 12/2008 | Aoki ........................ G02B 7/04 359/823 |
| 2010/0014176 A1* | 1/2010 | Wang ................ H02K 41/0356 359/822 |
| 2011/0075280 A1* | 3/2011 | Chou ........................ G02B 7/08 359/824 |
| 2011/0080516 A1* | 4/2011 | Yi ........................ H04N 5/2253 348/374 |
| 2012/0140101 A1* | 6/2012 | Afshari ............... H04N 5/2257 348/308 |

(Continued)

*Primary Examiner* — Igwe U Anya
(74) *Attorney, Agent, or Firm* — Winston Hsu

(57) ABSTRACT

An apparatus includes a lens component and an integrated circuit package. The lens component has a lens and a through hole from a specific surface to a bottom surface of the lens component. The integrated circuit package has a sensor and a second portion on a top surface of the integrated circuit package. The first portion on the bottom surface of the lens component is adjacent and attached to the second portion on the top surface of the integrated circuit package by an adhesive material that is injected via the through hole to the first portion and the second portion, for fixing the lens component to the integrated circuit package.

19 Claims, 7 Drawing Sheets

(56) References Cited

U.S. PATENT DOCUMENTS

2014/0362285 A1* 12/2014 Min .................. G02B 7/005
  348/374
2014/0367718 A1* 12/2014 Park .................. H01L 33/486
  257/98
2015/0212288 A1* 7/2015 Inagaki .................. G02B 7/08
  359/824

* cited by examiner

APPARATUS AND SENSOR CHIP COMPONENT ATTACHING METHOD

BACKGROUND OF THE INVENTION

1. Field of the Invention

The present invention relates to a circuit component attaching scheme, and more particularly to an apparatus and a sensor chip component attaching method.

2. Description of the Prior Art

Generally speaking, a conventional optical navigation system consists of a sensor mated with a lens and potentially a holder or bracket. The component (i.e. lens to sensor) attachment process and mechanism in current products may involve a conventional mechanical fitting scheme. The use of conventional mechanical fitting scheme has the advantage of simple assembly but still needs to provide for strong and more permanent adhesives between the lens and sensor. The use of adhesives enables strong and permanent attachment to be achieved. However, it becomes more difficult to use a conventional scheme for applying the adhesives between the lens and sensor since the size of the components in miniature optical navigation systems becomes smaller. The conventional scheme usually runs the risk of contaminating the optical surfaces of the lens in the process. Accordingly, it is important to provide a novel and effective/efficient attaching method without contaminating the optical surfaces of the lens in the process.

SUMMARY OF THE INVENTION

Therefore one of the objectives of the present invention is to provide an apparatus and sensor chip component attaching method to effectively and efficiently distribute adhesive material between a specific component and an integrated circuit package without contaminating surfaces used for other functions.

According to embodiments of the present invention, an apparatus is disclosed. The apparatus comprises a lens component and an integrated circuit package. The lens component has a lens and a through hole from a specific surface to a bottom surface of the lens component, and the bottom surface of the lens component has a first portion comprising an end of the through hole and being on the bottom surface. The integrated circuit package has a sensor and a second portion on a top surface of the integrated circuit package. The first portion on the bottom surface of the lens component is adjacent and attached to the second portion on the top surface of the integrated circuit package by an adhesive material that is injected via the through hole to the first portion and the second portion, for fixing the lens component to the integrated circuit package.

According to the embodiments of the present invention, a sensor chip component attaching method is disclosed. The attaching method comprises: providing a lens component having a lens and a through hole from a specific surface to a bottom surface of the lens component, the bottom surface of the lens component having a first portion comprising an end of the through hole and being on the bottom surface; providing an integrated circuit package having a sensor and a second portion on a top surface of the integrated circuit package; placing the bottom surface of the lens component on the top surface of the integrated circuit package; and injecting an adhesive material via the through hole to the first portion and second portion for fixing the lens component to the integrated circuit package.

By doing this, when the above-mentioned attaching method is applied for distributing adhesive material between the lens and sensor, the attaching method can more effectively and efficiently employ the adhesive material for fixing the lens component to the sensor without contaminating the lens or sensor, especially for miniature products.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
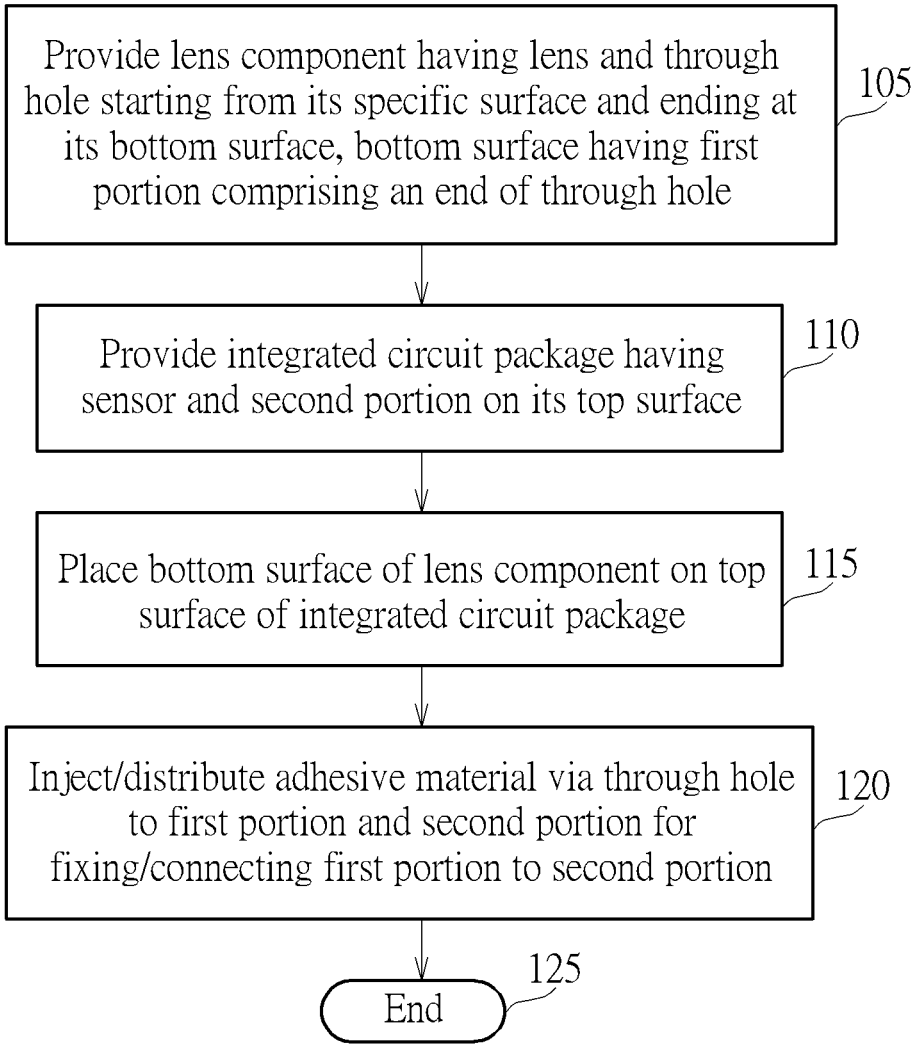
FIG. 1 is a diagram illustrating a flowchart of a sensor chip component attaching/assembling method according to embodiments of the present invention.

Please refer to FIG. 1, which is a diagram illustrating a flowchart of a sensor chip component attaching/assembling method according to embodiments of the present invention. In the embodiments, the attaching/assembling method is used for attaching/fixing a lens component/circuit to an integrated circuit package having a sensor. It should be noted that this attaching/assembling method can be also applied for any kinds of chip packages for attaching/fixing a specific component to an integrated circuit package, not limited to attaching a lens component to a sensor circuit package. Provided that substantially the same result is achieved, the steps of the flowchart shown in FIG. 1 need not be in the exact order shown and need not be contiguous, that is, other steps can be intermediate. The description of steps is detailed in the following:

Step 105: Provide a lens component having a lens and a through hole wherein the through hole starts from a specific surface and ends at a bottom surface of the lens component, the bottom surface of the lens component having a first portion comprising an end of the through hole and being on the bottom surface;

Step 110: Provide an integrated circuit package having a sensor and a second portion on a top surface of the integrated circuit package;

Step 115: Place the bottom surface of the lens component on the top surface of the integrated circuit package;

Step 120: Inject/distribute adhesive material via the through hole to the first portion and second portion for fixing/connecting the first portion to the second portion;

Step 125: End.

Figure 2A:
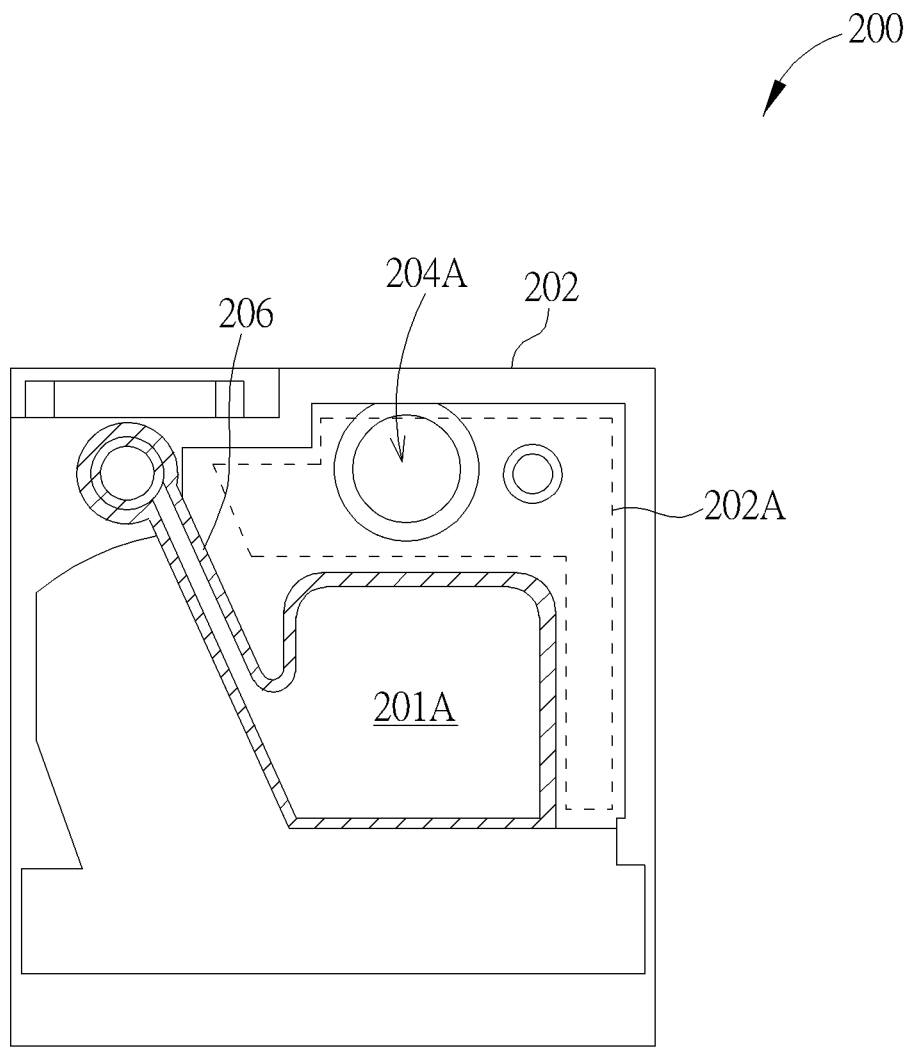
FIG. 2A is a diagram illustrating an example of a lens component in a bottom view according to a first embodiment of the present invention.
Figure 2B:
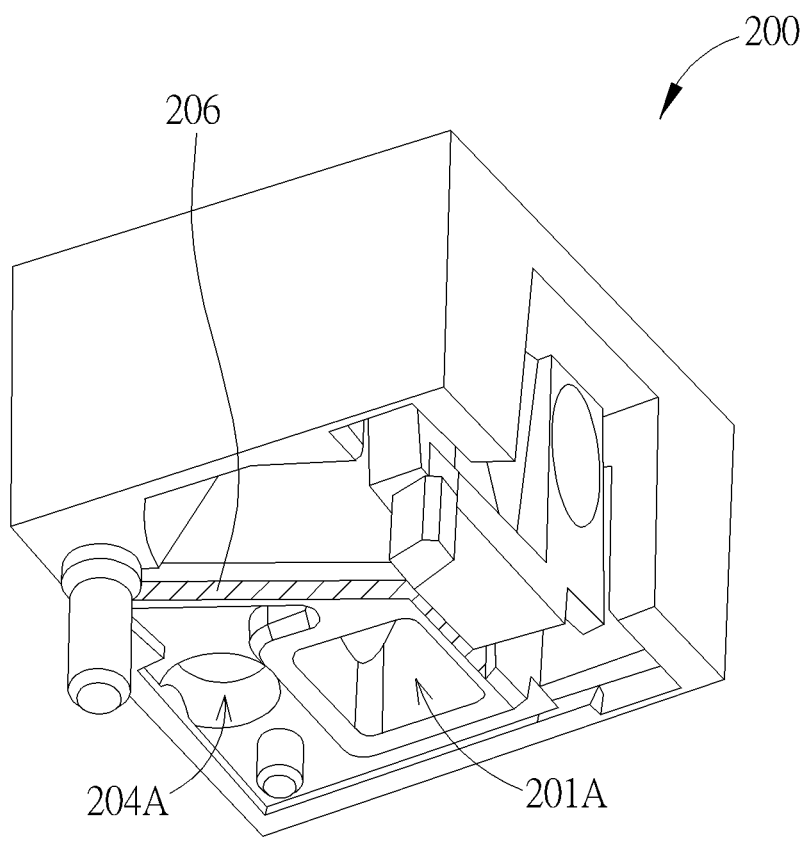
FIG. 2B is a diagram illustrating the example of the lens component in a side and bottom view according to the first embodiment.
Figure 2C:
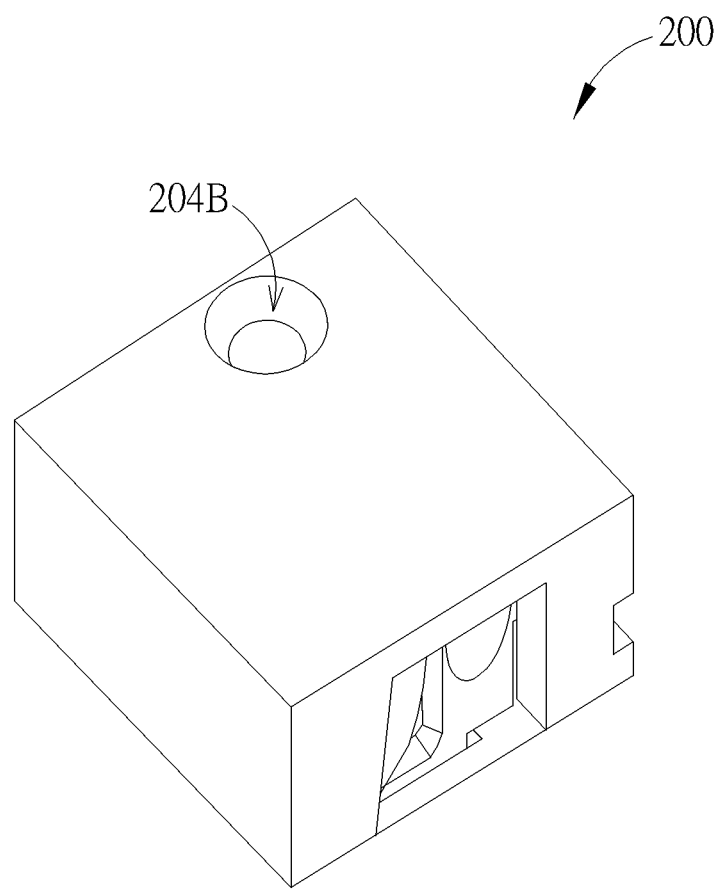
FIG. 2C is a diagram illustrating the example of the lens component in a side and top view according to the first embodiment.

FIG. 2A shows a diagram illustrating an example of a lens component 200 in a bottom view according to a first embodiment of the present invention. As shown in FIG. 2A, the lens component 200 comprises a lens 201A and a bottom surface 202 which includes a first portion 202A (or a first connecting area/piece). An end 204A of the through hole is disposed to be away from the lens 201A and may be disposed within or out of first portion 202A. In this embodiment, the end 204A is disposed within the first portion 202A. An erected wall 206 as shown in FIG. 2A is disposed at a side of the first portion 202A. The exerted wall 206 is disposed between the end 204A of the through hole and the lens 201A. FIG. 2B shows a diagram illustrating the example of the lens component 200 in a side and bottom view according to the first embodiment. FIG. 2C shows a diagram illustrating the example of the lens component 200 in a side and top view according to the first embodiment. As shown in FIG. 2C, another end 204B of the through hole is located at the top surface of lens component 200. In this embodiment, the through hole starting from the end 204B and ending at the end 204A is a vertically straight channel or via.

Figure 3A:
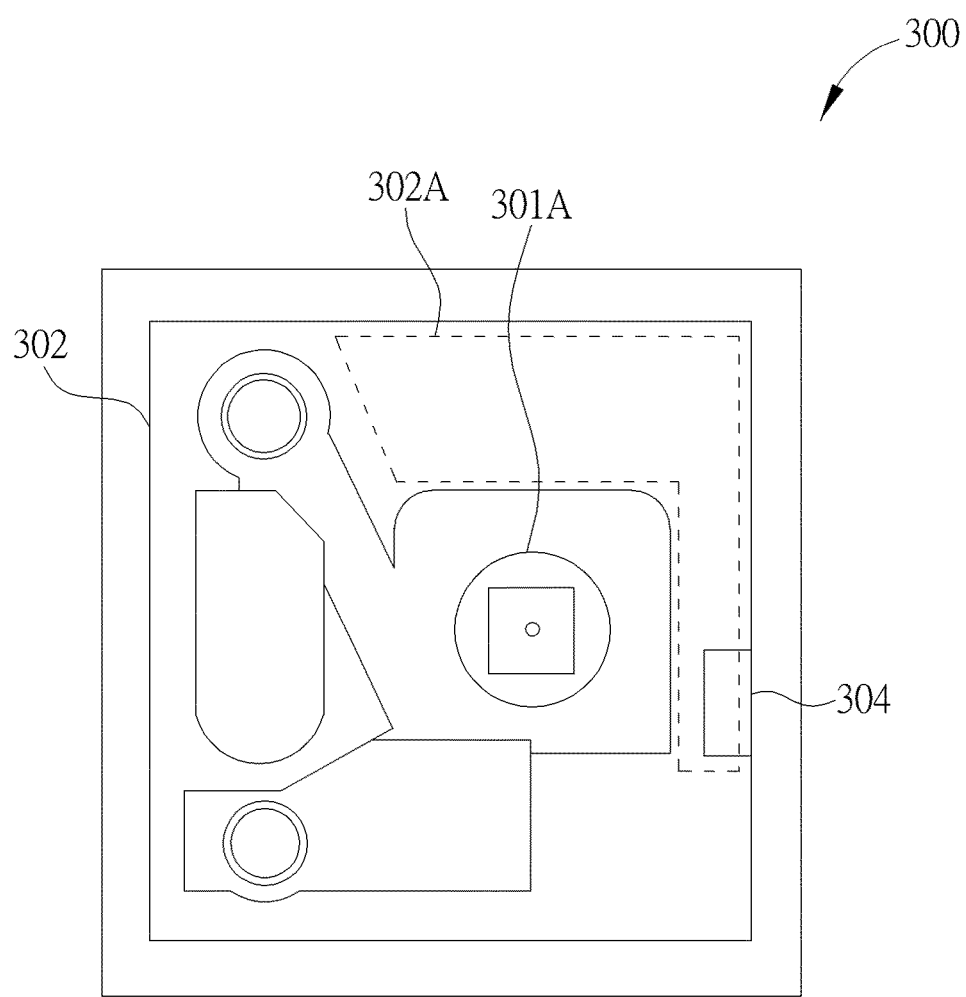
FIG. 3A is a diagram illustrating an example of an integrated circuit package in a top view according to the first embodiment of the present invention.
Figure 3B:
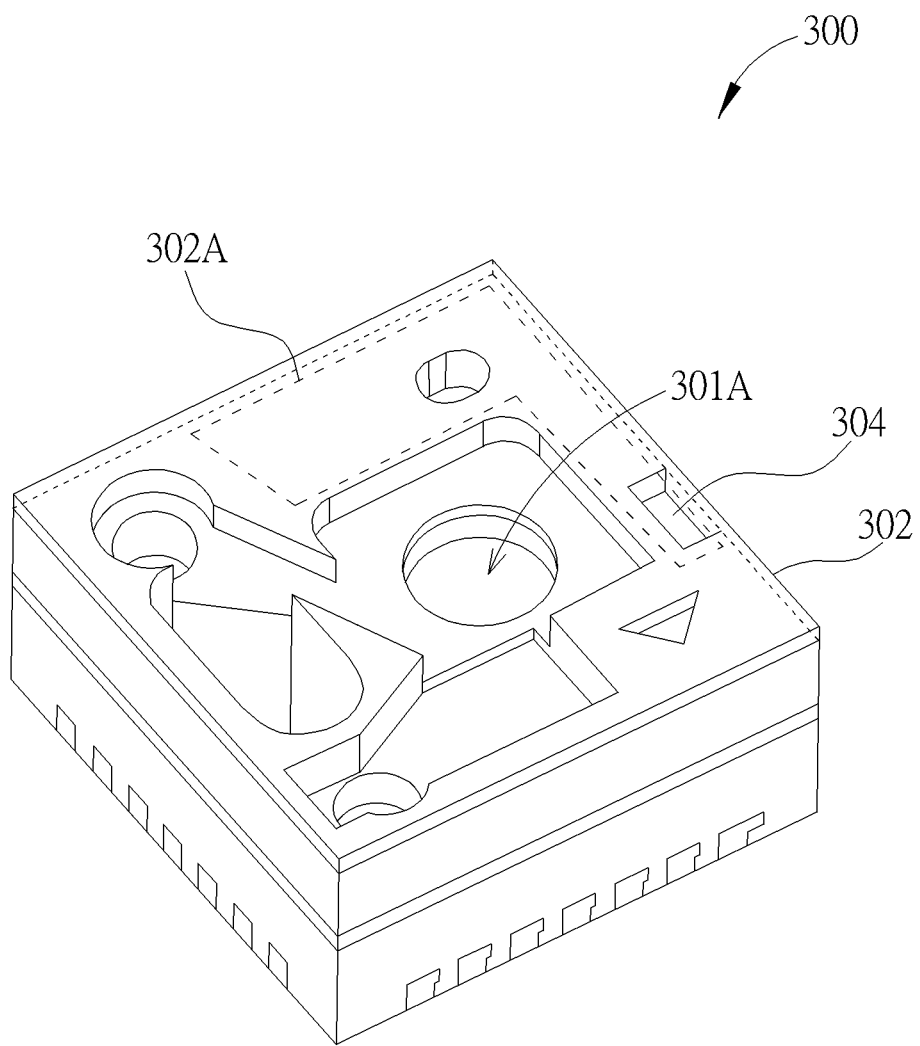
FIG. 3B is a diagram illustrating the example of the integrated circuit package in a side and top view according to the first embodiment of the present invention.

FIG. 3A is a diagram illustrating an example of an integrated circuit package 300 in a top view according to the first embodiment of the present invention. As shown in FIG. 3A, the integrated circuit package 300 comprises a sensor 301A and a top surface 302 which includes a second portion 302A (or called a second connecting area/piece). The second portion 302A on the top surface 302 of the integrated circuit package 300 further comprises an exit hole 304 for allowing excessive amount of injected adhesive material flow out of the second portion 302A. FIG. 3B is a diagram illustrating the example of the integrated circuit package 300 in a side and top view according to the first embodiment of the present invention.

Figure 4:
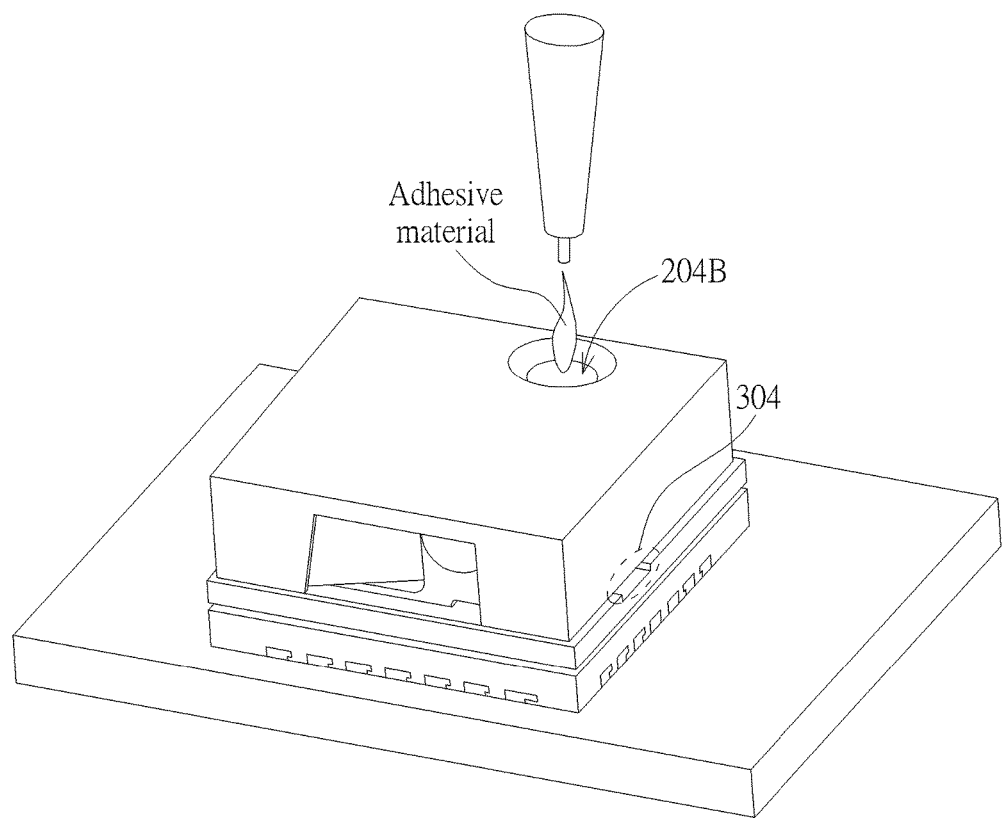
FIG. 4 shows a diagram illustrating how to inject or distribute the adhesive material into the through hole.

The process of attaching or fixing the lens component 200 to the integrated circuit package 300 is detailed as bellows. The bottom surface of lens component 200 is vertically placed onto the top surface of integrated circuit package 205 by making the first portion 202A in alignment with the second portion 302A and making the lens 201A in alignment with the sensor 301A respectively. Accordingly, the first portion (or connecting area) 202A on the bottom surface 202 of lens component 200 is adjacent/close to the second portion (or connecting area) 302A on the top surface 302 of integrated circuit package 300. Then, the adhesive material is injected or distributed from the specific surface (i.e. the top surface) of lens component 200 into the through hole. The adhesive may also be injected or distributed via a needle or nozzle inserted into the through hole. FIG. 4 shows a diagram illustrating how to inject or distribute the adhesive material into the through hole. As shown in FIG. 4, in this embodiment, the adhesive material is injected or distributed from the top surface of lens component 200. Then the through hole is filled with the adhesive material that is injected/distributed from the end 204B on the top surface of lens component 200, and then the injected adhesive material may flow from the other end 204A on the bottom surface of lens component 200. The adhesive material is distributed between the first portion 202A and second portion 302A, so that the first portion 202A is attached or fixed to the second portion 302A due to the distributed adhesive material. The exerted wall 206 disposed between the through hole and the lens 201A can be used for protecting the lens 201A or sensor 301A from being contaminated by excessive amount of the injected adhesive material. That is, the exerted wall 206 avoids the excessive amount of the adhesive material from flowing to the lens 201A or sensor 301A. In addition, the exit hole 304 can be used for making excessive amount of injected adhesive material flow out of the second portion 302A so as to avoid the excessive amount of adhesive material. Thus, by injecting/distributing the adhesive material into the through hole, the bottom surface 202 of lens component 200 can be attached and firmly fixed to the top surface 302 of integrated circuit package 300 without using any mechanical fitting schemes. This saves mechanical fitting costs.

The combination of lens component 200 and integrated circuit package 300 is installed on a circuit board; this is illustrated by FIG. 4. The through hole can be regarded as a receptacle or funnel to accept and guide the adhesive material down onto the interface between the bottom surface 202 of lens component 200 and the top surface 302 of integrated circuit package 300. The exit hole 304 is used for venting or bleeding any excessive adhesive material out of the interface so as to avoid contamination of the lens 201A. In this embodiment, the adhesive material filling the through hole forms in a rivet shape for attaching the first portion 202A to the second portion 302A. However, this is not meant to be a limitation of the present invention. In addition, it should be noted that the shapes of lens component 200, integrated circuit package 205, bottom surface of lens component 200, top surface of integrated circuit package 205, first portion 202A, and the second portion 302A are not intended to be limitations of the present invention. Other shapes also fall within the scope of the present invention. In addition, the through hole can be also implemented by non-straight via or channel. In addition, the adhesive material can be optically transparent adhesive or can be non-transparent.

Additionally, the through hole is not limited to starting from the top surface of the lens component 200. In another embodiment, the end 204B of through hole can be disposed at a side of the lens component 200 and ends at the bottom surface 202 of the lens component 200. Further, the erected wall mentioned above can be disposed at a side of the first portion 202A on the bottom surface 202 of the lens component 200 and closely contacted to the top surface 302 of the integrated circuit package 300, for protecting the lens 201A from being contaminated by the injected adhesive material.

Further, in another embodiment, the exerted wall can be disposed and implemented at a side of second portion 302A on the top surface 302 of the integrated circuit package 300, and can be closely contacted to the bottom surface 202 of the lens component 200, for protecting the lens 201A from being contaminated by the injected adhesive material.

Further, in another embodiment, an exerted wall can be disposed and implemented on the integrated circuit package 300, and the second portion 302A on the top surface 302 of the integrated circuit package 300 is surrounded by the erected wall which is used for closely contacted to the bottom surface 202 of the lens component 200 for protecting the lens 201A or sensor 301A from being contaminated by the injected adhesive material. The sensor 301A is not located within the second portion (or area) 302A. In addition, the erected wall may be with a gap being disposed at a side of the integrated circuit package 300, and the gap is used for making excessive amount of injected adhesive material flow out of the second portion 302A on the top surface 302 of the integrated circuit package 300.

Further, in another embodiment, the exit hole can be implemented and disposed at the lens component 200. The first portion 202A on the bottom surface 202 of the lens component 200 comprises an exit hole. When the first portion 202A is fixed to the second portion 302A due to the injected adhesive material, the exit hole can be used for making excessive amount of the injected adhesive material flow out of the second portion 302A on the top surface 302 of the integrated circuit package 300. This can also protect the lens 201A or sensor 301A from being contaminated by the injected adhesive material.

Further, in another embodiment, the adhesive material filling the through hole can form in another shape for attaching the first portion 202A to the second portion 302A.

The specific surface for example can be a top surface or a lateral surface of the lens component 200 (i.e. a side of the lens component). The through hole can be straight or non-straight. The above-mentioned attaching/assembling method is to make the first portion 202A be adjacent to the second portion 302A and then to inject the adhesive material into the through hole from the specific surface so that the adhesive material can be used for filling the through hole and used as an adhesive for fixing/sticking the first portion to the second portion. For example, the adhesive material can be glue, mucilage, or paste. In addition, it may be needed to heat-cure the adhesive material. However, this is not intended to be a limitation of the present invention. The adhesive material used for filling the through hole can form in the rivet shape for attaching the first portion to the second portion. By the rivet shape of adhesive material, the lens component and integrated circuit package can be firmly held together.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus comprising:
 a lens component having a lens and a through hole from a specific surface to a bottom surface of the lens component, the bottom surface of the lens component having a first portion comprising an end of the through hole and being on the bottom surface; and
 an integrated circuit package having a sensor and a second portion on a top surface of the integrated circuit package;
 wherein the first portion on the bottom surface of the lens component is placed on the second portion of the top surface of the integrated circuit package to form an L-shape hole at the end of the through hole, and the first portion is attached to the second portion on the top surface of the integrated circuit package by an adhesive material that is injected via the through hole to the first portion and the second portion, for fixing the lens component to the integrated circuit package; the adhesive material filling the through hole forms in a rivet for attaching the first portion to the second portion, and the rivet has a shaft body, a head area, and a tail area; and, the adhesive material filling the L-shape hole at the end of the through hole forms the head area of the rivet while the tail area of the rivet is an area of another end of the through hole on the specific surface; the head area of the rivet has two pieces, and the two pieces and the shaft body of the rivet are respectively aligned with three-dimensional axes to fix the bottom surface of the lens component to the top surface of the integrated circuit package in the three-dimensional axes separately.

2. The apparatus of claim 1, wherein the through hole is from a top surface of the lens component to the bottom surface of the lens component.

3. The apparatus of claim 1, wherein the through hole is from a side of the lens component to the bottom surface of the lens component.

4. The apparatus of claim 1, wherein the through hole is vertically straight.

5. The apparatus of claim 1, wherein an erected wall is disposed at a side of the first portion on the bottom surface of the lens component and closely connected to the top surface of the integrated circuit package, for protecting the lens from being contaminated by the injected adhesive material.

6. The apparatus of claim 1, wherein an erected wall is disposed at a side of the second portion on the top surface of the integrated circuit package and closely connected to the bottom surface of the lens component, for protecting the lens from being contaminated by the injected adhesive material.

7. The apparatus of claim 1, wherein the sensor is not located within the second portion, and the second portion on the top surface of the integrated circuit package is surrounded by an erected wall which is used for closely connected to the bottom surface of the lens component for protecting the lens/sensor from being contaminated by the injected adhesive material.

8. The apparatus of claim 7, wherein the erected wall is with a gap being disposed at a side of the integrated circuit package, and the gap is used for making excessive amount of injected adhesive material flow out of the second portion on the top surface of the integrated circuit package.

9. The apparatus of claim 1, wherein the second portion on the top surface of the integrated circuit package comprises an exit hole for making excessive amount of injected adhesive material flow out of the second portion.

10. The apparatus of claim 1, wherein the first portion on the bottom surface of the lens component comprises an exit hole for making excessive amount of injected adhesive material flow out of the second portion on the top surface of the integrated circuit package.

11. The apparatus of claim 1, wherein a length of one of the two pieces of the rivet is longer than half of a length of the top surface of the integrated circuit package, and a length of the other of the two pieces of the rivet is longer than half of a width of the top surface of the integrated circuit package.

12. A sensor chip component attaching method, comprising:
 providing a lens component having a lens and a through hole from a specific surface to a bottom surface of the lens component, the bottom surface of the lens component having a first portion comprising an exit of the through hole and being on the bottom surface;
 providing an integrated circuit package having a sensor and a second portion on a top surface of the integrated circuit package;
 placing the bottom surface of the lens component on the top surface of the integrated circuit package to form an L-shape area at one end of the through hole; and
 injecting an adhesive material via the through hole to the first portion and second portion for fixing the lens component to the integrated circuit package; wherein the adhesive material filling the through hole forms in a rivet for attaching the first portion to the second portion, and the rivet has a shaft body, a head area, and a tail area; and, the head area of the rivet is the L-shape area at the end of the through hole while the tail area of the rivet is an area of another end of the through hole on the specific surface; the L-shape area of the rivet has two pieces, and the two pieces and the shaft body of the rivet shape are respectively aligned with three-dimensional axes to fix the bottom surface of the lens component to the top surface of the integrated circuit package in the three-dimensional axes respectively.

13. The sensor chip component attaching method of claim 12, wherein the through hole is from a top surface of the lens component to the bottom surface of the lens component.

14. The sensor chip component attaching method of claim 12, wherein the through hole is from a side of the lens component to the bottom surface of the lens component.

15. The sensor chip component attaching method of claim 12, wherein the through hole is vertically straight.

16. The sensor chip component attaching method of claim 12, wherein an erected wall is disposed at a side of the first portion on the bottom surface of the lens component, and the method further comprises:
    closely connecting the erected wall to the top surface of the integrated circuit package, for protecting the lens from being contaminated by the injected adhesive material.

17. The sensor chip component attaching method of claim 12, wherein an erected wall is disposed at a side of the second portion on the top surface of the integrated circuit package, and the method further comprises:
    closely connecting the erected wall to the bottom surface of the lens component, for protecting the lens from being contaminated by the injected adhesive material.

18. The sensor chip component attaching method of claim 12, wherein the sensor is not located within the second portion, the second portion on the top surface of the integrated circuit package is surrounded by an erected wall, and the method further comprises:
    closely connecting the erected wall to the bottom surface of the lens component, for protecting the lens from being contaminated by the injected adhesive material.

19. The sensor chip component attaching method of claim 12, wherein a length of one of the two pieces of the rivet is longer than half of a length of the top surface of the integrated circuit package, and a length of the other of the two pieces of the rivet is longer than half of a width of the top surface of the integrated circuit package.

* * * * *